United States Patent [19]

Jen et al.

[11] Patent Number: 4,743,870
[45] Date of Patent: May 10, 1988

[54] LONGITUDINAL MODE FIBER ACOUSTIC WAVEGUIDE WITH SOLID CORE AND SOLID CLADDING

[75] Inventors: Cheng K. Jen, Brossard, Canada; Ahmad Safaai-Jazi, Blacksburg, Va.; Jean F. Bussière, St. Bruno; Gerald W. Farnell, Montreal, both of Canada

[73] Assignee: Canadian Patents and Development Ltd., Ottawa, Canada

[21] Appl. No.: 910,539

[22] Filed: Sep. 23, 1986

[30] Foreign Application Priority Data

Oct. 3, 1985 [CA] Canada .................................. 492228

[51] Int. Cl.$^4$ ............................................. H03H 9/30
[52] U.S. Cl. .................................... 333/147; 333/141; 333/145; 333/149; 350/96.29; 367/140
[58] Field of Search ............... 350/96.29, 96.30, 96.34; 333/141, 142, 147, 149, 145, 208; 367/140, 169, 191, 912; 181/0.5, 139, 141

[56] References Cited

U.S. PATENT DOCUMENTS

| | | | |
|---|---|---|---|
| 3,824,505 | 7/1974 | Borner | 333/145 |
| 3,922,622 | 11/1975 | Boyd et al. | 333/145 |
| 3,975,698 | 8/1976 | Redman | 333/141 |
| 4,077,023 | 2/1978 | Boyd et al. | 333/147 |

Primary Examiner—John Lee
Attorney, Agent, or Firm—Yoshiharu Toyooka

[57] ABSTRACT

An elastic waveguide, for propagating acoustic waves, consists of an elongated solid core region and an elongated solid outer cladding region. The acoustic waves propagate in a mode where the principle particle displacement is substantially parallel to the longitudinal axis of the waveguide, this mode is called longitudinal mode. The material densities and the bulk shear wave velocities of the core and cladding region are substantially the same but the bulk longitudinal wave velocity of the cladding region is larger than that of the core region.

6 Claims, 4 Drawing Sheets

LONGITUDINAL MODE FIBER ACOUSTIC WAVEGUIDE WITH SOLID CORE AND SOLID CLADDING

FIELD OF THE INVENTION

This invention relates to an elastic waveguide, having a solid core and cladding regions, for acoustic waves propagation. The acoustic waves propagate in a longitudinal mode where the principle particle displacement is parallel to the longitudinal axis of the waveguide.

DESCRIPTION OF THE PRIOR ART

There have been a few acoustic waveguides constructed or proposed for propagating acoustic waves. These waveguides comprise an elongated central core region and a cladding region, both regions being composed of materials in which elastic waves can be propagated. The characteristics of the two regions are so chosen that they confine and contain energy predominantly within the core region.

Known in the art is an elastic waveguide for propagating acoustic wave in radial, tortional and longitudinal modes (U.S. Pat. No. 3,922,622, Nov. 25, 1975 G. D. Boyd and L. A. Coldren). The patent discloses an elastic waveguide with solid cladding region and liquid core region for propagating acoustic wave in longitudinal modes where the shear and longitudinal wave velocities of the cladding region should exceed the longitudinal wave velocity of the liquid core region.

Also shown in the art is an elastic waveguide for propagating acoustic waves in shear modes (U.S. Pat. No. 4,077,023, Feb. 28, 1978 G. D. Boyd and R. N. Turston). The patent discloses an elastic waveguide with solid cladding and solid core regions where the shear wave velocity of the cladding region is larger than the shear wave velocity of the core region. The guiding condition of the acoustic waves in the Boyd-Coldren and Boyd-Thurston patents requires that the shear velocity of the core region has to be slower than that of the cladding region.

Although all of the above elastic waveguides are suitable for propagating acoustic waves in the radial, tortional and shear modes, none of these elastic waveguides can propagate acoustic waves in a true longitudinal mode efficiently without problems. The elastic waveguide with liquid core and solid cladding disclosed in the U.S. Pat. No. 3,922,622 may be excited in a longitudinal mode but the use of liquid core generates some problems as high acoustic loss in liquid, difficulty in fabrication and less mechanical strength. Another elastic waveguide with solid core and solid cladding is also disclosed in the U.S. Pat. No. 3,922,622 for torsional and radial modes. This waveguide may be excited in a longitudinal mode but because of its inherent characteristics it cannot propagate acoustic wave in a true longitudinal mode with enough efficiency to be of interest for practical use.

There are needs for an elastic waveguide for propagating acoustic waves in a longitudinal mode efficiently.

Another need is to achieve the above needs with an elastic waveguide having a solid core and a solid cladding region.

Still another need is for an elastic waveguide, for propagating acoustic waves in a longitudinal mode, which can be coupled simply and efficiently even for very high frequencies.

SUMMARY OF THE INVENTION

We have now discovered that elastic waves can be propagated in waveguides having a solid core and solid cladding regions in a new set of propagation modes referred to herein as longitudinal modes. The longitudinal modes are characterized by principle particle displacement which is substantially parallel to the longitudinal axis of the waveguide. Acoustic waves can be propagated in an elastic waveguide, having a solid core and solid cladding region, in longitudinal modes provided that the material densities and the bulk shear wave velocities of the core and cladding region are substantially the same and the bulk longitudinal wave velocity of the core region is less than that of the cladding region. According to the present invention there is provided an elastic waveguide for propagating acoustic waves comprising a core region having a central longitudinal axis parallel to the longitudinal axis of the waveguide, the core region being of material in which bulk elastic waves can be propagated; a cladding region enclosing all surfaces except end surfaces of the core region, the cladding region being of material in which bulk elastic waves can be propgated; the core and cladding materials being selected so that the propagation of the acoustic energy is mostly confined within the core region in a mode in which principle particle displacement is substantially parallel to the central longitudinal axis of the waveguide.

The materials of the core and cladding regions may be selected so that the relation between the bulk longitudinal wave velocities of the core and cladding regions are of the form $$0 < \frac{V_{L2} - V_{L1}}{V_{L1}} << 1$$

where $V_{L1}$ and $V_{L2}$ are respectively the bulk longitudinal wave velocities of the core and cladding regions.

The materials of the core and cladding regions may be selected so that the relation between the bulk shear wave velocities of the core and cladding regions is of the form $$\left| \frac{V_{s2} - V_{s1}}{V_{s1}} \right| << 1$$

where $V_{s1}$ and $V_{s2}$ are respectively the bulk shear wave velocities of the core and cladding regions.

The materials of the core and cladding regions may be selected so that the relation between the densities of the core and and cladding regions is of the form $$\left| \frac{\rho_2 - \rho_1}{\rho_1} \right| << 1$$

where $\rho_1$ and $\rho_2$ are respectively the densities of the core and the cladding regions.

BRIEF DESCRIPTION OF THE DRAWINGS

In the accompanying drawings which illustrate by way of example some embodiments of the present invention and prior art.

In FIG. 1 there is shown a side sectional view of an elastic waveguide 1 for propagating acoustic waves in longitudinal modes which are characterized by principal particle displacement which is substantially parallel to the longitudinal axis of the waveguide. The waveguide 1 is coupled at one end to a driver 2 and at the other end to a receiver 4. The driver 2 may be a source of either digital or analog high frequencies, the frequencies being in the range of 10 to 100 MHz. The receiver 4 could be any suitable circuit appropriate to the signals provided by the driver 2. The waveguide 1 has a solid core region 6 having a central longitudinal axis parallel to the longitudinal axis of the waveguide, the core region 6 being of material in which bulk elastic waves can propagate, and a solid cladding region enclosing all surfaces except end surfaces of the core region 6, the cladding region 8 being of material in which bulk elastic waves can propagate. The materials of the core and cladding regions could be doped or pure fused silica. The core and the cladding materials are selected so that the material density and the shear wave velocity of the cladding region 8 are equal or nearly equal to the corresponding properties of the core region 6 and the bulk longitudinal velocity of the core region 6 is less than that of the cladding region 8. The three above criteria of selection could be represented by the the three following equations:

$$\left| \frac{V_{s2} - V_{s1}}{V_{s1}} \right| << 1$$

where $V_{s1}$ and $V_{s2}$ are respectively the bulk shear wave velocities of the core and the cladding regions;

$$\left| \frac{\rho_2 - \rho_1}{\rho_1} \right| << 1$$

where $\rho_1$ and $\rho_2$ are respectively the material densities of the core and cladding regions; and $$0 < \frac{V_{L2} - V_{L1}}{V_{L1}} << 1$$

where $V_{L1}$ and $V_{L2}$ are respectively the bulk longitudinal wave velocities of the core and cladding regions.

The core and cladding bulk longitudinal velocities may be close to one another so that, advantageously, the waveguide 1 will have low dispersion over a wider range of frequencies. However, the velocities should differ sufficiently, typically by 1 to 30 percent, to have reasonable energy guiding in the core region 6. The core and cladding materials may have substantially the same temperature coefficient of expansion for facilitating the manufacturing of the waveguide. In order to propagate efficiently an acoustic signal, the diameter of the core region 6 has to be at least twice the wavelength of the lowest frequency component of said acoustic signal.

A jacket medium 12 surrounds the waveguide for supporting and protecting it from external mechanical shock. The selection of the jacket medium 12 is less critical for the present invention as long as the radius of the cladding region 8 is at least three times greater than the radius of the core region 6. The jacket medium 12 does not significantly affect the energy propagation in the waveguide except to absorb spurious signals. Alternatively, clamps could be used for support as long as they do not crush the waveguide as to impose internal strains that could substantially distort the acoustic field of the longitudinal mode.

Figures 2A, 2B, 2C:
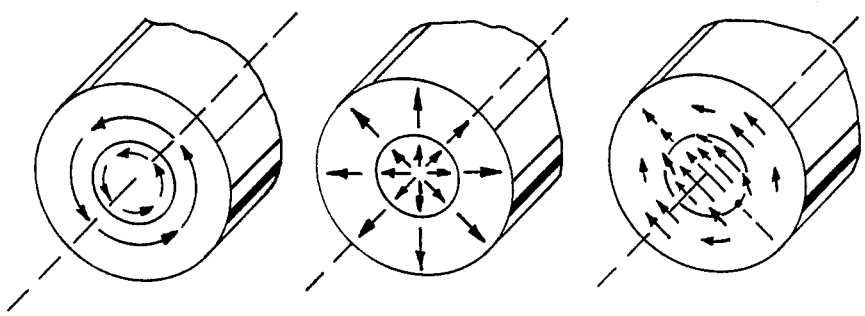
FIGS. 2a, 2b and 2c illustrate graphically the principal particle displacement of modes known in the art.

In FIG. 2 there is shown principal particle displacement of modes known in the art. In FIG. 2a there is shown the principal particle displacement of the fundamental torsional mode $T_{o1}$. This mode is azimuthal, the displacement is alternately clockwise and counterclockwise around the central longitudinal axis of the waveguide. In FIG. 2b there is shown the principal particle displacement of the fundamental radial mode $R_{o1}$. In this mode the displacement is into and away from the central longitudinal axis of the waveguide. In FIG. 2c there is shown the principal particle displacement of the fundamental shear mode $F_{11}$. In this mode the displacement is substantially linear in a direction parallel to a plane perpendicular to the central longitudinal axis of the waveguide.

Figure 1:
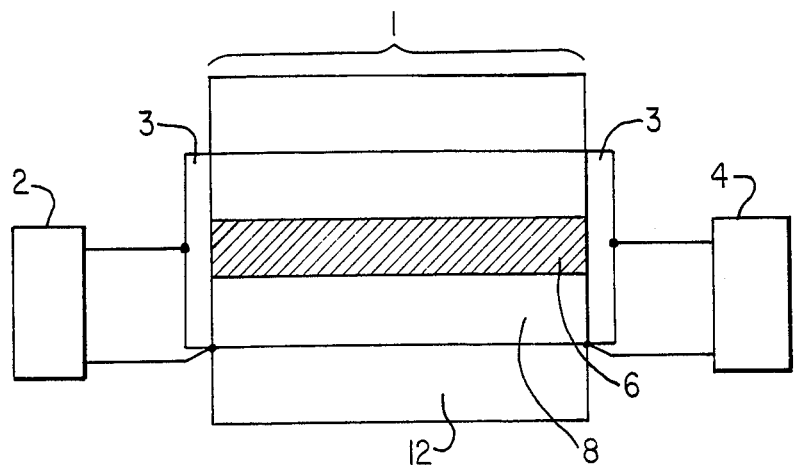
FIG. 1 is a simplified side sectional view of an elastic waveguide according to one embodiment of the present invention in combination with transducers for exciting and detecting acoustic waves in accordance with the present invention.

In accordance with the present invention, we have discovered a new set of acoustic propagation modes, herein referred to as longitudinal modes which can be propagated in the waveguide shown in FIG. 1.

Figure 3:
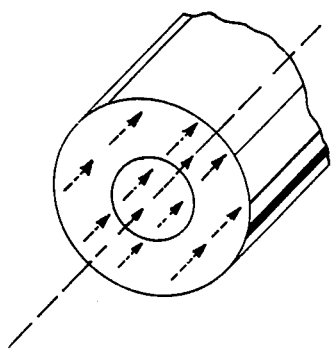
FIG. 3 illustrates graphically the principal particle displacement of the fundamental longidutinal mode in accordance with the present invention.

In FIG. 3 there is shown the particle displacement of the fundamental longitudinal mode $L_{o1}$. In this mode the displacement is substantially linear in the direction parallel to the central longitudinal axis of the waveguide.

Figure 4A:
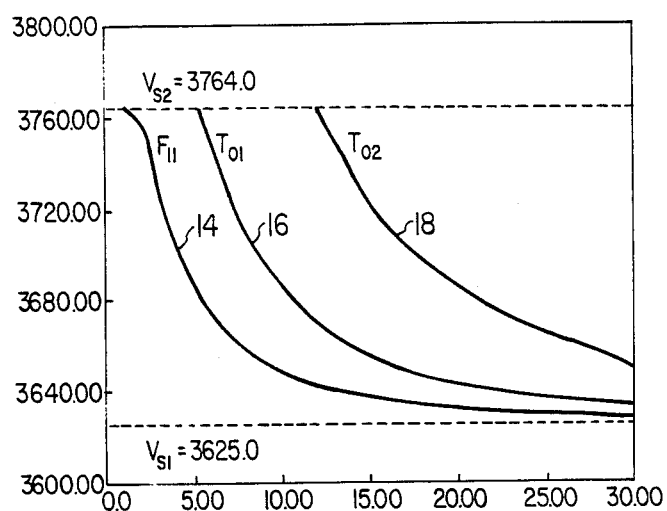
FIGS. 4a and 4b illustrate graphically dispersion curves for propagation modes.
Figure 4B:
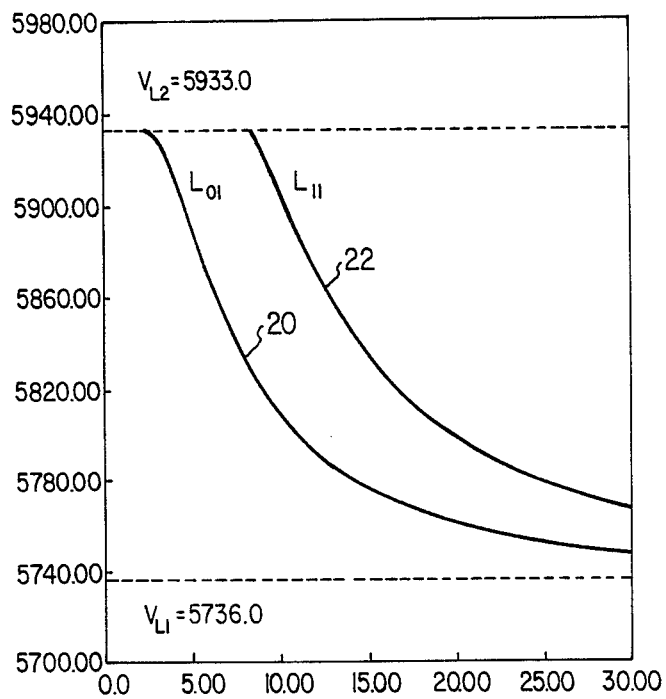
Figure 5A:
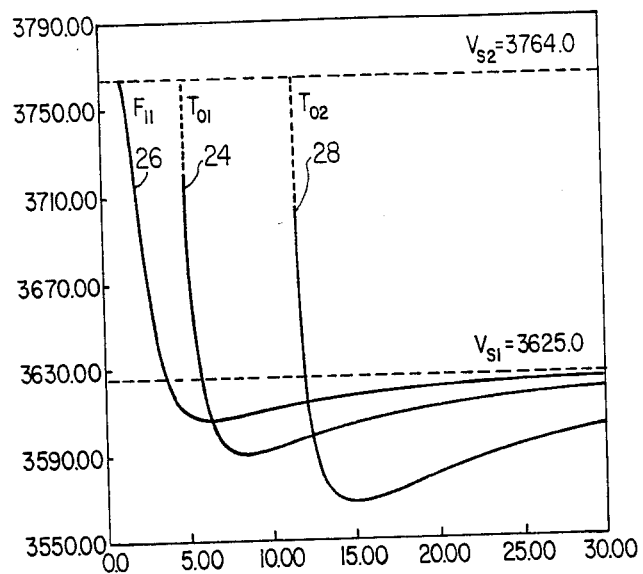
FIGS. 5a and 5b illustrate graphically group velocity curves for propagating modes.
Figure 5B:
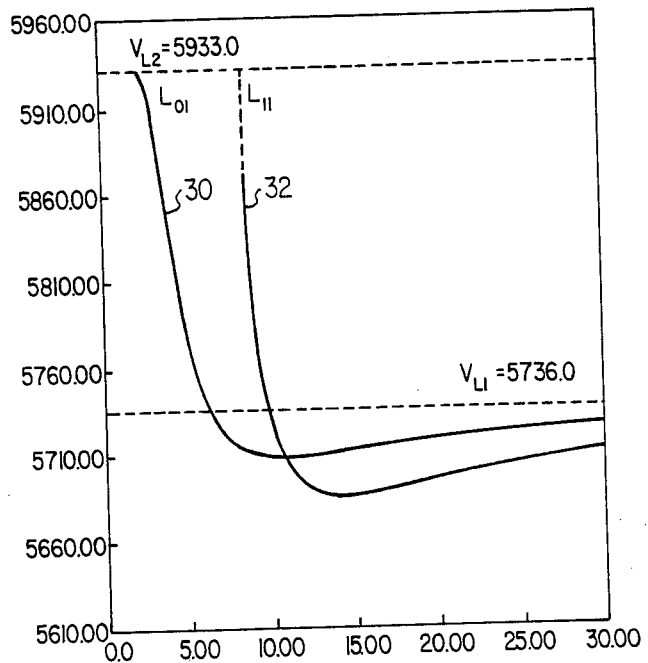

In FIG. 4 and FIG. 5 there are shown respectively dispersion and group velocity curves for several modes propagating in a waveguide having a core and cladding regions. These curves plot respectively phase and group velocities in m/sec as a function of the product of the core radius and the frequency f in $10^3$ Micron-MHz. The waveguide represented in FIG. 4a and FIG. 5a has a pure fused silica cladding and Corning 7971 Ti doped fused silica core material, the latter having a 3.8 percent lower shear wave velocity than the former and both materials having almost the same density. The waveguide represented in FIG. 4b and FIG. 5b has a pure fused silica cladding and Corning 7971 Ti doped fused silica core material, the latter having a 3.4 percent lower longitudinal wave velocity than the former and both materials having almost the same density. For purposes of FIG. 4 and FIG. 5, the ratio b/a has been assumed to be infinite where b is the radius of the cladding and a is the radius of the core. However, the curves of realistic values such as $b/a=3$, are quite similar to those shown. The main objective of these figures is to clearly identify the characteristics of longitudinal modes according to the present invention from those of the radial, torsional and shear modes known in the art.

In FIG. 4a there is shown phase velocities for different modes known in the art. Curve $T_{o1}$ 16 represents the phase velocity of the fundamental torsional mode, the phase velocities of the fundamental radial mode $R_{o1}$ and the shear mode $F_{21}$ are very similar to the phase velocity of the mode $T_{o1}$. Curve $F_{11}$ 14 represents the phase velocity of the fundamental shear mode $F_{11}$. Curve $T_{o2}$ 18 represents the phase velocity of the tortional mode $T_{o2}$ and the phase velocity of the mode $R_{o2}$ is very similar to the phase velocity of the mode $T_{o2}$.

In FIG. 4b there is shown phase velocities for longitudinal modes according to the present invention. Curve $L_{o1}$ 20 represents the phase velocity for the fundamental longitudinal mode $L_{o1}$. Curve $L_{11}$ 22 represents the phase velocity of the longitudinal mode $L_{11}$. The curves are significant in that they indicate the quality of guidance as a function of frequency (f)-core radius (a) product. Both cutoff frequencies of $F_{11}$ mode and $L_{o1}$ mode have been proved to be zero. It means that they are all pass modes, but the shear wave $F_{11}$ has lower phase velocity and a predominantly shear particle displacement and the longitudinal mode $L_{o1}$ has higher phase velocity and a predominantly longitudinal particle displacement.

In FIG. 5a there is shown group velocities for different modes known in the art. Curve $T_{o1}$ 24 represents the group velocity of the fundamental torsional mode, the group velocities of the fundamental radial mode $R_{o1}$ and the shear mode $F_{21}$ are very similar to the group velocity of the mode $T_{o1}$. Curve $F_{11}$ 26 represents group velocity of the fundamental shear mode $F_{11}$. Curve $T_{o2}$ 28 represents the group velocity of the torsional mode $T_{o2}$ and the group velocity of $R_{o2}$ is very similar to the group velocity of the mode $T_{o2}$.

In FIG. 5b there is shown group velocities for longitudinal modes according to the present invention. Curve $L_{o1}$ 30 represents the group velocity for the fundamental longitudinal mode $L_{o1}$. Curve $L_{11}$ 32 represents group velocity of the longitudinal mode $L_{11}$.

FIG. 4 and FIG. 5 clearly indicate the differences between the longitudinal modes according to the present invention and the torsional, radial and shear modes known in the art.

Figure 6:
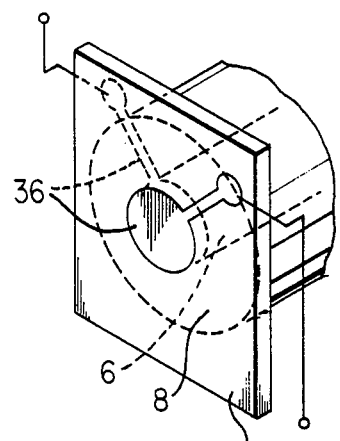
FIG. 6 illustrates a bulk longitudinal wave transducer which can be used to launch and detect longitudinal mode elastic waves in the waveguide of FIG. 1.

In FIG. 6 there is shown a bulk longitudinal wave transducer which can be used to excite the fundamental longitudinal mode in the waveguide of FIG. 1. The transducer comprises a piezoelectric plate 34. The material of plate 34 being selected for genrating elastic waves in longitudinal modes, for example it could be made of 36 degrees rotate Y-cut lithium niobate, X-cut quartz and lead zirconate titanate piezoelectric ceramics with the C axis normal to the face of the plate 34, the C axis being perpendicular to the X and Y axis. Alternatively, it may be made of a piezoelectric polymer such as PVF2. The plate 34 is centered on the waveguide central longitudinal axis and extends laterally beyond the periphery of the cladding region 8. Drive electrodes 36 are applied to the exposed and waveguide side of the plate, respectively. Each electrode covers essentially the circular projection of the core cross section.

Figure 7:
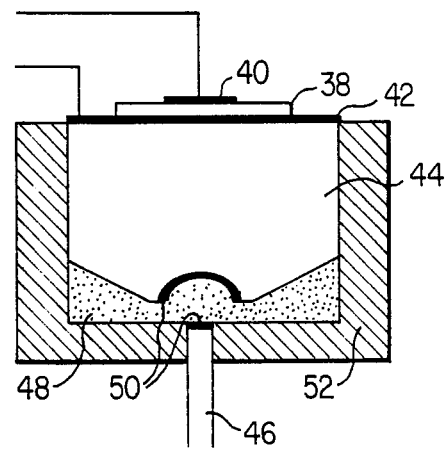
FIG. 7 illustrates a focussing bulk longitudinal wave transducer, having a liquid coupling medium, which can be used to launch and detect longitudinal mode elastic waves in the waveguide of FIG. 1.
Figure 8:
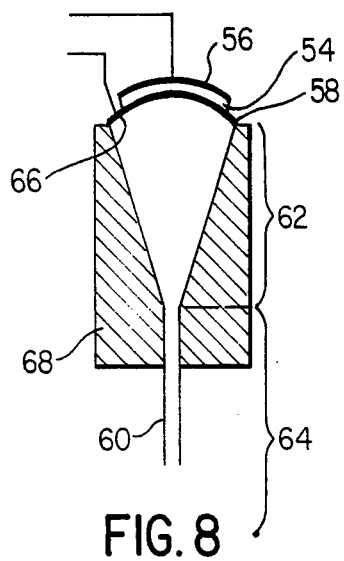
FIG. 8 illustrates a focussing bulk longitudinal wave transducer, having a curved piezoelectric member, which can be used to launch and detect longitudinal mode elastic waves in a waveguide having an enlarged curved termination.
Figure 9:
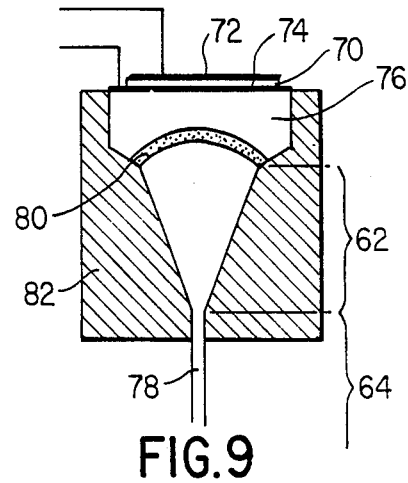
FIG. 9 illustrates a focussing bulk longitudinal wave transducer, having a liquid coupling medium, which can be used to launch and detect longitudinal mode elastic waves in a waveguide having an enlarged curved termination.

In FIGS. 7, 8, and 9 there is shown other acoustic focussing transducer and waveguide configurations in which longitudinal modes of the present invention and, in particular the fundamental longitudinal mode, can be excited and detected. Thus, for example, waveguides in some high frequency ranges may be so small that the application of transducers is difficult. In such cases the acoustic focussing method can be used to ease the difficulty.

In FIG. 7 there is shown a bulk focussing longitudinal wave transducer which can be used to excite and focus elastic waves in longitudinal modes in the waveguide shown in FIG. 1. The transducer comprises a piezoelectric plate 38, the material of the plate 38 being selected for generating elastic waves in longitudinal modes, a first electrode 40 attached on a side of the plate 38, a second electrode 42 attached on the opposite side of the plate 38, a solid member 44 placed in contact with the piezoelectric plate 38 on one side and connected to an end of the waveguide 46 on its opposite side by means of a liquid medium 48. In order to produce a focussing effect on the elastic waves, the solid member side connected with the waveguide 46 is of spherical concave form, the spherical form being centered on the core end of the waveguide 46. The solid member 44 is made of material in which bulk elastic waves can be propagated. In order to have better acoustic impedance matching, the liquid medium 48 may be liquid metals such as mercury or gallium. If signal frequency is sufficiently high, acoustic impedance matching layer 50 may be added between the solid member 44 and the medium liquid 48 and between the end surface of the waveguide 46 and the liquid medium 48 to improve the acoustic impedance matching hence acoustic energy transfer. A solid jacket medium 52 secures together the solid member 44, the liquid medium 48 and the waveguide 46.

In FIG. 8 there is shown a bulk focussing longitudinal wave transducer which can be used to excite and focus elastic waves in longitudinal modes inside the core of a longitudinal mode waveguide. The transducer comprises a curved piezoelectric plate 54, the material of the plate 54 being selected for generating elastic waves in longitudinal modes, a first electrode 56 attached on the convex side of the plate 54, a second electrode 58 attached on the concave side of the plate 54, the concave side of the plate 54 being connected to the waveguide 60.

The core and cladding materials of the waveguide 60 are selected in accordance with the criteria set for the waveguide shown in FIG. 1. The waveguide end portion 62, of substantially enlarged cross sectional diameter as compared to an intermediate portion 64 of the waveguide 60, has an end surface 66 of convex form connected with the concave from of the piezoelectric member 54. The cross sectional diameter of the waveguide 60 is gradually tapered between the end portion 62 and the intermediate portion 64. The piezoelectric member 54 is a curved piezoelectric thin film, such as ZnO, PZT or piezoelectric polymer such as PVF2, which can be attached, vacuum evaporated, vacuum sputtered or grown by chemical vapour deposition on the convex end surface 66 of the waveguide 60 to achieve acoustic focusing effect. The curvature of the end surface 66 provides that junction between the end portion 62 and the intermediate portion 64 is located at the focal region of the focussed elastic waves. A solid jacket medium 68 secures together the end portion 62 and the intermediate portion 64.

In FIG. 9 there is shown a bulk focusing longitudinal wave transducer which can be used to excite and focus elastic waves in longitudinal modes inside the core of a longitudinal mode waveguide. The transducer comprises a piezoelectric plate 70, the material of the plate 70 being selected for generating elastic waves in longitudinal modes, a first electrode 72 attached on a side of the plate 70, a second electrode 74 attached on the opposite side of the plate 70, a solid member 76 having one side connected with the piezoelectric plate 70 and its opposite side connected with an end of the waveguide 78 by means of a liquid medium 80, the solid member side connected with the waveguide 78 being of concave form. The solid member 76 is made of material in which bulk elastic waves can be propagated. The piezoelectric member 70 is a flat piezoelectric thin film, such as ZnO, PZT or polymer such as PVF2, which is attached or grown on the surface of the solid member 76. The core and cladding materials of the waveguide are selected in accordance with the criteria set for the waveguide shown in FIG. 1. The end portion 62 and the intermediate portion 64 of the above waveguide 78 are adapted as the ones shown on FIG. 8.

A solid jacket medium 82 secures together the solid member 76, the liquid medium 80, the end portion 62 and the intermediate portion 64 of the waveguide 78.

We claim:

1. An elastic waveguide having a longitudinal axis for propagating acoustic waves therealong comprising:
   a core region having a central longitudinal axis parallel to the longitudinal axis of the waveguide, the core being of material in which bulk elastic waves can be propagated; and
   a cladding region enclosing all surfaces except end surfaces of the core region, the cladding region being of material in which bulk elastic waves can be propagated;
   the materials of the core and cladding regions being selected so that the relation between the bulk longitudinal wave velocities of the core and cladding regions are of the form $$0 < \frac{V_{L2} - V_{L1}}{V_{L1}} << 1$$

where $V_{L1}$ and $V_{L2}$ are respectively the bulk longitudinal wave velocities of the core and cladding regions, and the propagation of the energy of the acoustic waves is mostly confined within the core region in a mode in which principal particle displacement is substantially parallel to the central longitudinal axis of the waveguide.

2. The waveguide as defined in claim 1 wherein the materials of the core and cladding regions are selected so that the relation between the bulk shear wave velocities of the core and cladding regions are of the form $$\left| \frac{V_{s2} - V_{s1}}{V_{s1}} \right| << 1$$

where $V_{s1}$ and $V_{s2}$ are respectively the bulk shear wave velocities of the core and cladding regions.

3. The waveguide as defined in claim 2 wherein the materials of the core and cladding regions are selected so that the relation between the material densities of the core and cladding regions are of the form $$\left| \frac{\rho_2 - \rho_1}{\rho_1} \right| << 1$$

where $\rho_1$ and $\rho_2$ are respectively the material densities of the core and cladding regions.

4. An electro-mechanical focusing longitudinal mode transducer for launching and detecting acoustic waves in a waveguide as defined in claim 1 comprising:
   a piezoelectric member, the material of the member being selected for generating acoustic waves in a mode in which principal particle displacement is parallel to the longitudinal axis of the waveguide,
   a first electrode attached on a side of the member,
   a second electrode attached on the opposite side of the member, and
   a solid member placed in contact with the piezoelectric member on one side and connected to an end of the waveguide on its opposite side, which is of spherical concave form, by means of a liquid medium, the spherical form being substantially centered on the core end of the waveguide whereby acoustic waves are focused in the core of the waveguide.

5. In combination, an electro-mechanical focussing longitudinal mode transducer for launching and detecting acoustic waves in the waveguide as defined in claim 1 and having two extremities along the longitudinal axis comprising:
   a piezoelectric member, the material of the member being selected for generating acoustic waves in a mode in which principal particle displacement is parallel to the longitudinal axis of the waveguide;
   a first electrode attached on a side of the piezoelectric member;
   a second electrode attached on the opposite side of the piezoelectric member;
   a solid member placed in contact with the piezoelectric member on one side and connected to an end of the waveguide on its opposite side, which is of spherical concave form, by means of a liquid medium, the spherical form being substantially centered on the core end of the waveguide;
   the waveguide further comprising:
   an intermediate portion situated between the two extremities of the waveguide,
   an end portion situated at one extremity of the waveguide, of substantially enlarged cross section as compared to an intermediate portion, having an end surface of convex form connected to the solid member by means of a liquid medium, the cross section of the waveguide being gradually tapered between the end portion and the intermediate portion.

6. In combination, an electro-mechanical focusing longitudinal mode transducer for launching and detecting acoustic waves in a waveguide as defined in claim 1 and having two extremities along the longitudinal axis comprising:
   a curved piezoelectric member being convex on one side and concave on the opposite side, the material of the member being selected for generating acoustic waves in a mode in which principal particle displacement is parallel to the longitudinal axis of the waveguide;

a first electrode attached on the convex side of the member;

a second electrode attached on the concave side of the member; and the waveguide further comprising:

an intermediate portion situated between the two extremities of the waveguide, an end portion situated at one extremity of the waveguide, of substantially enlarged cross section as compared to an intermediate portion, having an end surface of convex form placed in contact with the concave side of the piezoelectric member, the cross section of the waveguide being gradually tapered between the end portion and the intermediate portion.

* * * * *